United States Patent
Kim et al.

(10) Patent No.: US 9,502,246 B2
(45) Date of Patent: Nov. 22, 2016

(54) METHODS OF FORMING OXIDE SEMICONDUCTOR DEVICES AND METHODS OF MANUFACTURING DISPLAY DEVICES HAVING OXIDE SEMICONDUCTOR DEVICES

(71) Applicants: Samsung Display Co., Ltd., Yongin, Gyeonggi-do (KR); University-Industry Foundation (UIF), Yonsei University, Seoul (KR)

(72) Inventors: Yeon-Hong Kim, Hwaseong-si (KR); Byung-Du Ahn, Hwaseong-si (KR); Hyeon-Sik Kim, Yongin-si (KR); Yeon-Gon Mo, Yongin-si (KR); Ji-Hun Lim, Goyang-si (KR); Hyun-Jae Kim, Seoul (KR)

(73) Assignees: Samsung Display Co., Ltd., Gyeonggi-do (KR); University-Industry Foundation (UIF), Yonsei University, Seoul (KR)

( * ) Notice: Subject to any disclaimer, the term of this patent is extended or adjusted under 35 U.S.C. 154(b) by 73 days.

(21) Appl. No.: 14/455,805

(22) Filed: Aug. 8, 2014

(65) Prior Publication Data
US 2015/0140699 A1   May 21, 2015

(30) Foreign Application Priority Data

Nov. 15, 2013  (KR) .......................... 10-2013-0138985

(51) Int. Cl.
*H01L 21/02* (2006.01)
(52) U.S. Cl.
CPC ... *H01L 21/02664* (2013.01); *H01L 21/02422* (2013.01); *H01L 21/02488* (2013.01); *H01L 21/02554* (2013.01); *H01L 21/02565* (2013.01); *H01L 2227/323* (2013.01)
(58) Field of Classification Search
CPC .............. H01L 121/0231; H01L 21/2414; H01L 21/02483; H01L 21/02488; H01L 21/02554; H01L 21/02664; H01L 21/76825; H01L 21/76828; H01L 2227/323; H01L 29/7869
See application file for complete search history.

(56) References Cited

U.S. PATENT DOCUMENTS

| | | | |
|---|---|---|---|
| 2007/0264786 A1 | 11/2007 | Chen et al. | |
| 2009/0298226 A1* | 12/2009 | Umeda ............. | H01L 21/02554 438/104 |
| 2009/0305468 A1 | 12/2009 | Jung et al. | |
| 2010/0182223 A1* | 7/2010 | Choi .................... | G09G 3/3233 345/76 |
| 2013/0288426 A1* | 10/2013 | Akimoto ........... | H01L 29/66765 438/104 |

FOREIGN PATENT DOCUMENTS

| KR | 2008-0105740 | 4/2008 |
|---|---|---|
| KR | 2009-0126813 | 9/2009 |
| KR | 2010-0120939 | 11/2010 |

OTHER PUBLICATIONS

P. Liu et al., Effect of Exposure to Ultraviolet-Activated Oxygen on the Electrical Characteristics of Amorphous Indium Gallium Zinc Oxide Thin Film Transistors. ECS Solid State Letters, 2 (4) Q21-Q24 (2013). The Electrochemical Society.

* cited by examiner

*Primary Examiner* — Thanhha Pham
(74) *Attorney, Agent, or Firm* — Knobbe Martens Olson & Bear LLP

(57) ABSTRACT

A method of forming an oxide semiconductor device may be provided. In the method, a substrate comprising a first major surface and a second major surface that faces away from the first major surface may be provided. An oxide semiconductor device may be formed over the first major surface to provide an intermediate device, and the semiconductor device may comprise an oxide active layer. The intermediate device may be subjected to ultraviolet (UV) light (e.g., ultraviolet ray irradiation process) for a first period, and subjected to heat (e.g., thermal treatment process) for a second period. The first and second periods may at least partly overlap.

20 Claims, 10 Drawing Sheets

230  220  210

230  240  220  210

METHODS OF FORMING OXIDE SEMICONDUCTOR DEVICES AND METHODS OF MANUFACTURING DISPLAY DEVICES HAVING OXIDE SEMICONDUCTOR DEVICES

CROSS-REFERENCE TO RELATED APPLICATION(S)

This application claims priority under 35 U.S.C. §119 to Korean patent Application No. 10-2013-0138985, filed on Nov. 15, 2013, the disclosure of which is hereby incorporated by reference herein in its entirety.

BACKGROUND

Technical Field

Example embodiments of the invention relate to methods of forming oxide semiconductor devices and methods of manufacturing display devices having oxide semiconductor devices. More particularly, example embodiments of the invention relate to methods of forming oxide semiconductor devices having enhanced electrical characteristics by simultaneously performing an ultraviolet ray irradiation process and a thermal treatment process, and methods of manufacturing display devices including the oxide semiconductor devices.

Description of the Related Art

An oxide semiconductor device including an active pattern containing an oxide semiconductor device may be employed in various display devices such as an active matrix liquid crystal display, an active matrix organic light emitting device, etc.

In conventional methods of forming the oxide semiconductor device, damage to an active pattern may be caused during a process in which a metal thin film for forming a source electrode and a drain electrode is deposited on the active pattern and/or a process in which the metal thin film for forming the source electrode and the drain electrode is patterned. As a result, electrical characteristics of the oxide semiconductor device such as operating current, threshold voltage distribution, mobility, etc. may be degraded because of the damage to the active pattern.

SUMMARY

Example embodiments provide methods of forming oxide semiconductor devices having enhanced electrical characteristics by simultaneously performing an ultraviolet ray irradiation process and a thermal treatment process after forming a source electrode and a drain electrode.

Example embodiments provide methods of manufacturing display devices including the oxide semiconductor devices with enhanced electrical characteristics.

According to one aspect of the invention, there is provided a method of making an oxide semiconductor device. In the method, a substrate comprising a first major surface and a second major surface that faces away from the first major surface may be provided. An oxide semiconductor device may be formed over the first major surface to provide an intermediate device, and the semiconductor device may comprise an oxide active layer. The intermediate device may be subjected to ultraviolet (UV) light (e.g., ultraviolet ray irradiation process) for a first period, and subjected to heat (e.g., thermal treatment process) for a second period. The first and second periods may at least partly overlap.

In example embodiments, the ultraviolet ray irradiation process may be carried out for about 10 second to about 1 hour.

In example embodiments, the ultraviolet ray irradiation process may be executed using an ultraviolet ray having a wavelength between about 185 nm and about 370 nm.

In example embodiments, the ultraviolet ray irradiation process may be performed using the ultraviolet ray generated from an ultraviolet ray lamp or a short wavelength light emitting diode (LED). For example, the ultraviolet ray may have an energy density less than about 254 mW/cm$^2$.

In example embodiments, the thermal treatment process may be carried out under an atmosphere including air, oxygen, ozone, nitrogen, or argon.

In example embodiments, the thermal treatment process may be performed for about 10 second to about 1 hour.

In example embodiments, the thermal treatment process may be executed at a temperature less than about 400° C.

In example embodiments, the thermal treatment process may be performed using a hot plate or a furnace.

In example embodiments, the ultraviolet ray irradiation process may comprise applying the UV light from a side of the first major surface of the substrate or from a side of the second major surface of the substrate. Additionally, the thermal treatment process may comprise applying the heat from the side of the first major surface or the second major surface.

In some example embodiments, the ultraviolet ray irradiation process may comprise applying the UV light from both the side of the first major surface and the side of the second major surface. Further, the thermal treatment process may comprise applying the heat from both the side of the first major surface and the side of the second major surface.

In example embodiments, the oxide active layer may include a semiconductor oxide containing a binary compound (ABx), a ternary compound (ABxCy) and/or a quaternary compound (ABxCyDz).

In example embodiments, the oxide active layer may include the semiconductor oxide containing indium (In), zinc (Zn), gallium (Ga), stannum (Sn), titanium (Ti), aluminum (Al), hafnium (Hf), zirconium (Zr) and/or magnesium (Mg).

In some example embodiments, the oxide active layer pattern may have a composition in which lithium (Li), natrium (Na), manganese (Mn), nickel (Ni), palladium (Pd), copper (Cu), carbon (C), nitrogen (N), phosphorus (P), titanium (Ti), zirconium (Zr), vanadium (V), rubidium (Ru), germanium (Ge), stannum (Sn) and/or fluorine (F) is or are added to the semiconductor oxide.

In example embodiments, an etching stop layer may be additionally formed on the oxide active layer. A protection layer may be formed to cover the etching stop layer, a source electrode and a drain electrode.

In example embodiments, the etching stop layer and the protection layer may be formed after the ultraviolet ray irradiation process and the thermal treatment process.

According to another aspect of the invention, there is provided a method of manufacturing a display device. In the method, a substrate comprising a first major surface and a second major surface that faces away from the first major surface may be provided. An oxide semiconductor device may be formed over the first major surface to provide an intermediate device, and the semiconductor device may comprise an oxide active layer. The intermediate device may include a gate electrode formed on the first major surface and a gate insulation layer formed on the first major surface over the gate electrode. The intermediate device may be subjected to ultraviolet (UV) light (e.g., ultraviolet ray irradiation process) for a first period, and subjected to heat (e.g., thermal treatment process) for a second period. The first and second periods may at least partly overlap. Subsequent to subjecting the UV light and the heat, a light emitting diode may be formed over the intermediate device. The light emitting diode may be connected to the oxide semiconductor device and comprise an organic light emitting layer.

In example embodiments, the ultraviolet ray irradiation process may comprise applying the UV light from a side of the first major surface of the substrate or from a side of the second major surface of the substrate. Alternatively, the ultraviolet ray irradiation process may comprise applying the UV light from both the side of the first major surface and the side of the second major surface. The thermal treatment process may comprise applying the heat from the side of the first major surface or the second major surface. Alternatively, the thermal treatment process may comprise applying the heat from both the side of the first major surface and the side of the second major surface.

In example embodiments, an etching stop layer may be additionally formed on the oxide active layer, and a protection layer may be formed to cover the etching stop layer, a source electrode, and a drain electrode.

In example embodiments, the etching stop layer and the protection layer may be formed after the ultraviolet ray irradiation process and the thermal treatment process.

According to example embodiments, the ultraviolet ray irradiation process and the thermal treatment process may be simultaneously carried out after forming a source electrode and a drain electrode on the gate insulation layer and the oxide active layer. Therefore, damage caused to the oxide active layer while forming the source and the drain electrodes may be prevented. In addition, moisture and/or hydroxyl group generated during the process of forming the oxide semiconductor device may be efficiently reduced or removed. Accordingly, the oxide semiconductor device according to example embodiments may ensure enhanced electrical characteristics such as reduction of operating current, increase of threshold voltage distribution, reduction of mobility, etc. As a result, when the oxide semiconductor device is employed in the display device such as the organic light emitting display device, the liquid crystal display device, the flexible display device, etc., the display device may have increased quality of images and also may ensure enhanced operating speed.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
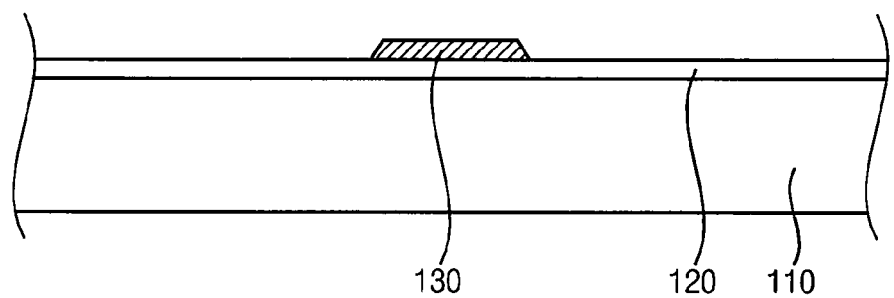
FIGS. 1 through 6 are cross-sectional views illustrating a method of forming an oxide semiconductor device in accordance with example embodiments.

Hereinafter, methods of forming oxide semiconductor devices and methods of manufacturing display devices having oxide semiconductor devices in accordance with example embodiments will be explained in detail with reference to the accompanying drawings.

It will be understood that although the terms "first" and "second" are used herein to describe various elements, these elements should not be limited by these terms. These terms are only used to distinguish one element from another element. Thus, a first element discussed below could be termed a second element, and similarly, a second element may be termed a first element without departing from the teachings of this disclosure.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on" another element or layer, the element or layer can be directly on another element or layer or intervening elements or layers.

In the drawings, the sizes and the thicknesses of layers and regions are exaggerated for convenience of explanation, and thus the sizes and the thicknesses are not limited thereto.

FIGS. 1 through 6 are cross-sectional views illustrating a method of forming an oxide semiconductor device in accordance with example embodiments.

Referring to FIG. 1, a buffer layer 120 may be formed on a first face (e.g. the surface that faces upward in FIG. 1) of a substrate 110. The substrate 110 may include a transparent insulation substrate. For example, the substrate 110 may include a glass substrate, a transparent resin substrate, a transparent metal oxide substrate, etc.

The buffer layer 120 may prevent diffusion of impurities from the substrate 110. In addition, the buffer layer 120 may enhance flatness of the surface of the substrate 110. When the substrate 110 has a relatively irregular surface, the buffer layer 120 may enhance a flatness of the surface of the first substrate 10. Furthermore, in a case that the buffer layer 120 is formed on the substrate 110, a gate electrode 130 may be more easily formed because stress generated while forming the gate electrode 130 may be decreased by the buffer layer 120. The buffer layer 120 may be formed using a silicon compound. For example, the buffer layer 120 may include silicon oxide (SiOx), silicon oxycarbide (SiOxCy), etc. These may be used alone or in any mixture thereof. The buffer layer 120 may have a single layer structure or a multi layer structure including the silicon compound.

The gate electrode 130 may be formed on the buffer layer 120. The gate electrode 130 may be connected to a gate line of a display device including the oxide semiconductor device. The gate electrode 130 may include metal, alloy, conductive metal oxide, a transparent conductive material, etc. For example, the gate electrode 130 may be formed using any of aluminum (Al), alloy containing aluminum, aluminum nitride (AlNx), silver (Ag), alloy containing silver, tungsten (W), tungsten nitride (WNx), copper (Cu), alloy containing copper, nickel (Ni), alloy containing nickel, chrome (Cr), molybdenum (Mo), alloy containing molybdenum, titanium (Ti), titanium nitride (TiNx), platinum (Pt), tantalum (Ta), tantalum nitride (TaNx), neodymium (Nd), scandium (Sc), strontium ruthenium oxide (SrRuxOy), zinc oxide (ZnOx), indium tin oxide (ITO), tin oxide (SnOx), indium oxide (InOx), gallium oxide (GaOx), indium zinc oxide (IZO), etc. These may be used alone or in any combination thereof.

Figure 2:
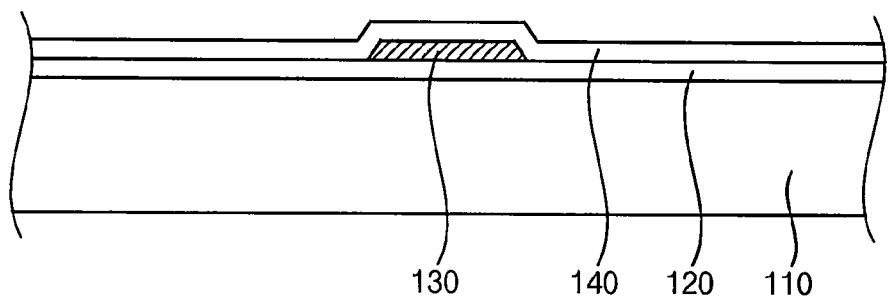

Referring to FIG. 2, a gate insulation layer 140 may be formed on the buffer layer 120 to cover the gate electrode 130. The gate insulation layer 140 may include a silicon compound, metal oxide, etc. For example, the gate insulation layer 140 may be formed using any of silicon oxide, silicon nitride, silicon oxynitride (SiOxNy), aluminum oxide (AlOx), tantalum oxide (TaOx), hafnium oxide (HfOx), zirconium oxide (ZrOx), titanium oxide (TiOx), etc. These may be used alone or in any combination thereof. In addition, the gate insulation layer 140 may have a single layer structure or a multi layer structure including the silicon compound and/or the metal oxide.

Figure 3:
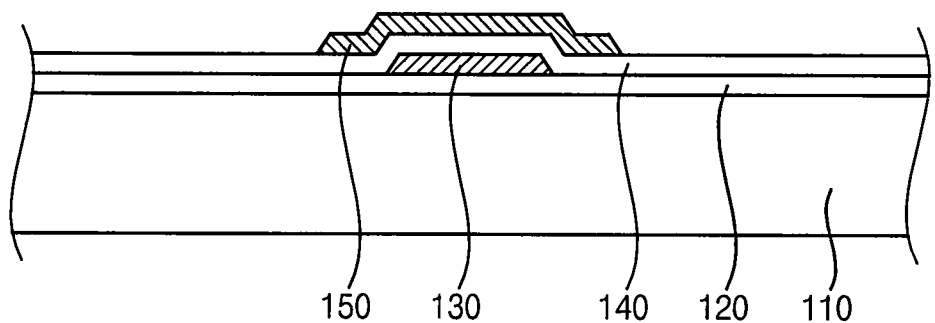

Referring to FIG. 3, a semiconductor layer (not illustrated) may be formed on the gate insulation layer 140, and then the semiconductor layer may be patterned to form an active pattern (e.g., active layer) 150. In example embodiments, the active pattern 150 include a binary compound (ABx) containing indium (In), zinc (Zn), gallium (Ga), tin (Sn), titanium (Ti), aluminum (Al), halfnium (Hf), zirconium (Zr), magnesium (Mg), etc., a ternary compound (ABxCy), for example, including such elements, or a quaternary compound (ABxCyDz), for example, including such elements, etc. For example, the active pattern 150 may include any of indium-gallium-zinc oxide (IGZO), gallium zinc oxide (GaZnxOy), indium tin oxide (ITO), indium zinc oxide (IZO), zinc magnesium oxide (ZnMgxOy), zinc tin oxide (ZnSnxOy), zinc zirconium oxide (ZnZrxOy), zinc oxide (ZnOx), gallium oxide (GaOx), titanium oxide (TiOx), tin oxide (SnOx), indium oxide (SnOx), indium-gallium-hafnium oxide (IGHO), tin-aluminum-zinc oxide (TAZO), indium-gallium-tin oxide (IGSO), etc. These may be used alone or in any combination thereof. In some example embodiments, the active pattern 150 may include a semiconductor oxide doped with any of lithium (Li), sodium (Na), manganese (Mn), nickel (Ni), palladium (Pd), copper (Cu), carbon (C), nitrogen (N), phosphorus (P), titanium, zirconium, vanadium (V), rubidium (Ru), germanium (Ge), tin, fluorine (F), etc. These may be used alone or in any mixture thereof. The active pattern 150 may have a single layer structure or a multi layer structure including the semiconductor oxide.

Figure 4:
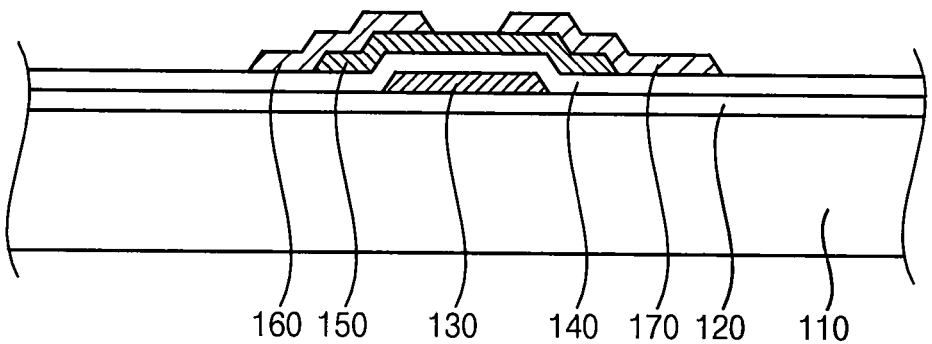

Referring to FIG. 4, a source electrode 160 and a drain electrode 170 may be formed on the gate insulation layer 140 and the active pattern 150. In example embodiments, an electrode layer (not illustrated) may be formed on the gate insulation layer 140 and the active pattern 150, and then a mask (not illustrated) may be formed over the electrode layer. Here, the electrode layer may be patterned to form the source electrode 160 and the drain electrode 170 separated from each other by a predetermined distance substantially centering the active pattern 150. The source electrode 160 and the drain electrode 170 may extend on the gate insulation layer 140 and may expose a central portion of the active pattern 150 (e.g., neither the source electrode 160 nor the drain electrode 170 is formed on the central portion of the active pattern 150).

Each of the source electrode 160 and the drain electrode 170 may be formed using any of metal, alloy, metal nitride, conductive metal oxide, a transparent conductive material, etc. For example, the source electrode 160 and the drain electrode 170 may be formed using any of aluminum, copper, molybdenum, titanium, chrome, tantalum, tungsten, neodymium, scandium, an alloy thereof, a nitride thereof, strontium ruthenium oxide, indium tin oxide, indium zinc oxide, zinc oxide, tin oxide, carbon nano tube (CNT), etc. These may be used alone or in any combination thereof. In addition, each of the source electrode 160 and the drain electrode 170 may have a single layer structure or a multi layer structure including any of the metal, the alloy, the metal nitride, the conductive metal oxide, the transparent conductive material, etc.

In a conventional method of forming a source electrode and a drain electrode of an oxide semiconductor device, damage to an active pattern may be caused during a process in which the electrode layer for forming the source electrode and the drain electrode are patterned because a metal thin film may be patterned as the electrode layer using plasma and/or an etchant. When the damage to the active pattern is generated, electrical characteristics of the oxide semiconductor device, such as operating current, threshold voltage distribution, mobility, etc. may be degraded because of the damage to the active pattern. Although the conventional method of forming the oxide semiconductor device may perform an ultraviolet ray irradiation process under an air atmosphere using an ultraviolet ray to improve electrical characteristics of the active pattern, the conventional ultraviolet ray irradiation process may not sufficiently enhance the electrical characteristic of the active pattern because the threshold voltage distribution may be easily shifted even if the ultraviolet ray is irradiated for a short irradiation time.

Figure 5:
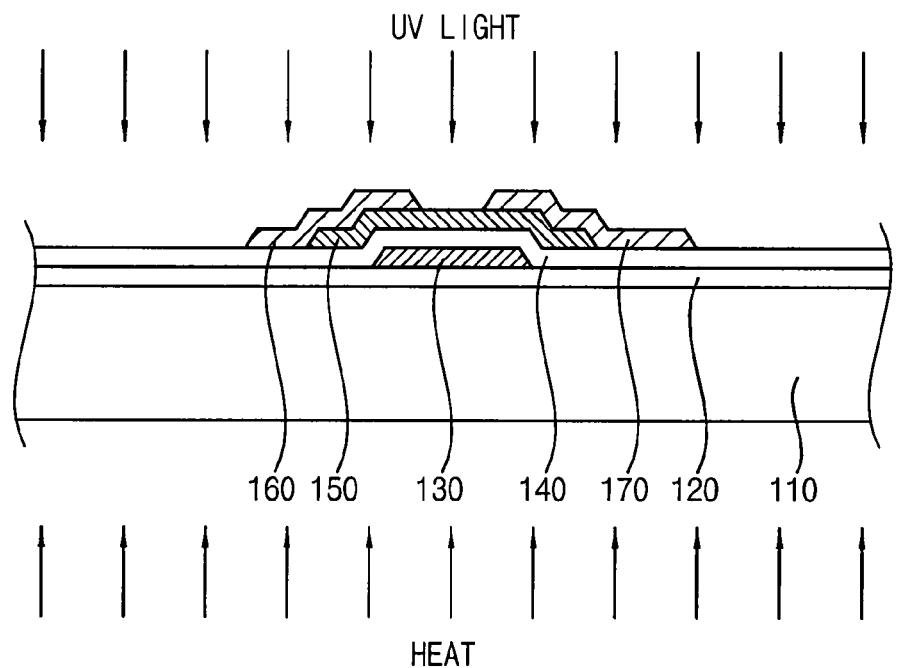

In example embodiments, as illustrated in FIG. 5, an ultraviolet ray irradiation process in which an ultraviolet ray is irradiated onto a first face of the substrate 110 (e.g., the top surface in FIG. 5), and also a thermal treatment process in which a heat is applied to a second face of the substrate 110 (e.g., the bottom surface in FIG. 5) opposed to the first face of the substrate 110 may be performed at the same time. For example, the ultraviolet ray irradiation process may be carried out for about 10 second to about 1 hour using an ultraviolet ray having a wavelength between about 185 nm and about 370 nm and an energy density less than about 254 mW/cm$^2$. In this case, the ultraviolet ray may be generated from an ultraviolet ray lamp or a short wavelength light emitting diode (LED). The thermal treatment process may be executed under an atmosphere including air, oxygen, ozone, nitrogen, or argon. In addition, the thermal treatment process may be performed at a temperature less than about 400° C. for about 10 second to about 1 hour. For example, the thermal treatment process may be carried out after that the substrate 110 may be disposed on a hot plate or the substrate 110 may be loaded in a furnace. Thus, the active pattern 150 may be cured, so that damage to the active pattern 150 generated in forming of the source electrode 160 and the drain electrode 170 may be efficiently reduced or removed. Furthermore, moisture and/or hydroxyl group at a surface of the active pattern 150 generated while forming the source and the drain electrodes 160 and 170 may be efficiently reduced or removed. Accordingly, the oxide semiconductor device may have enhanced electrical characteristics.

In example embodiments, the ultraviolet ray irradiation process may be performed on the second face of the substrate 110 (e.g., the bottom surface in FIG. 5), and the thermal treatment process may be executed on the first face of the substrate 110 (e.g., the top surface in FIG. 5). In some example embodiments, the ultraviolet ray irradiation process and the thermal treatment process may be simultaneously performed on the first and the second faces of the substrate 110. Therefore, electrical characteristics of the oxide semiconductor device may be efficiently improved.

In one embodiment, the ultraviolet ray irradiation process is performed on the first surface (e.g., top surface in FIG. 5) of the substrate 110. In another embodiment, the ultraviolet ray irradiation process is performed on the second surface (e.g., bottom surface in FIG. 5) of the substrate 110. In one embodiment, the thermal treatment process is performed on the first surface (e.g., top surface in FIG. 5) of the substrate 110. In another embodiment, the thermal treatment process is performed on the second surface (e.g., bottom surface in FIG. 5) of the substrate 110.

In one embodiment, the ultraviolet ray irradiation process is performed on the first surface (e.g., top surface in FIG. 5) of the substrate 110, and the thermal treatment process is performed on the first surface (e.g., top surface in FIG. 5) of the substrate 110. In another embodiment, the ultraviolet ray irradiation process is performed on the second surface (e.g., bottom surface in FIG. 5) of the substrate 110, and the thermal treatment process is performed on the first surface (e.g., top surface in FIG. 5) of the substrate 110. In one embodiment, the ultraviolet ray irradiation process is performed on the first surface (e.g., top surface in FIG. 5) of the substrate 110, and the thermal treatment process is performed on the second surface (e.g., bottom surface in FIG. 5) of the substrate 110. In another embodiment, the ultraviolet ray irradiation process is performed on the second surface (e.g., bottom surface in FIG. 5) of the substrate 110, and the thermal treatment process is performed on the second surface (e.g., bottom surface in FIG. 5) of the substrate 110. In one embodiment, the ultraviolet ray irradiation process and the thermal treatment process are both performed on the first surface (e.g., top surface in FIG. 5) of the substrate 110. In another embodiment, the ultraviolet ray irradiation process and the thermal treatment process are both performed on the second surface (e.g., bottom surface in FIG. 5) of the substrate 110.

Figure 6:
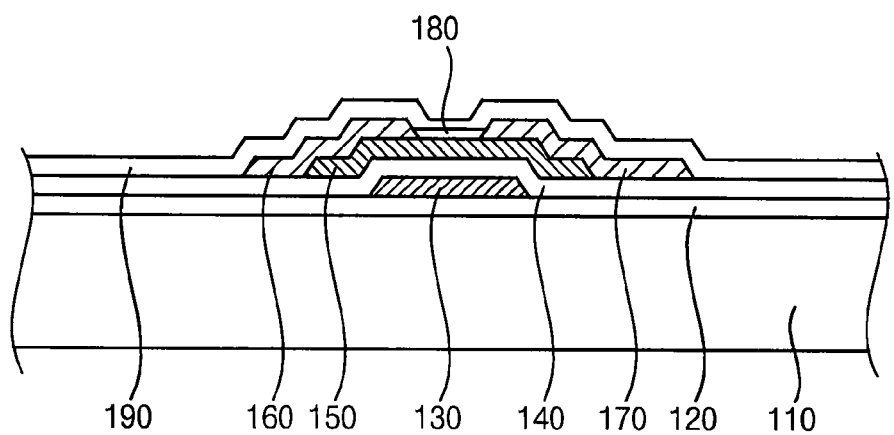

Referring to FIG. 6, an etching stop layer 180 may be formed on the active pattern 150 exposed by the source electrode 160 and the drain electrode 170. For example, the etching stop layer 180 may be formed using any of silicon oxide, silicon nitride, silicon oxynitride, semiconductor oxide, etc. These may be used alone or in any combination thereof.

A protection layer 190 may be formed on the gate insulation layer 140 to cover the source electrode 160, the drain electrode 170, and the etching stop layer 180. For example, the protection layer 190 may include any of silicon oxide, silicon nitride, silicon oxynitride, etc.

In the oxide semiconductor device described with reference to FIG. 6, the oxide semiconductor device may have a bottom gate construction in which the gate electrode 130 is disposed under the active pattern 150. However, the construction of the oxide semiconductor device may not be limited thereto. For example, the oxide semiconductor device may have a top gate construction in which the gate electrode 130 is disposed on the active pattern 150.

Figure 7:
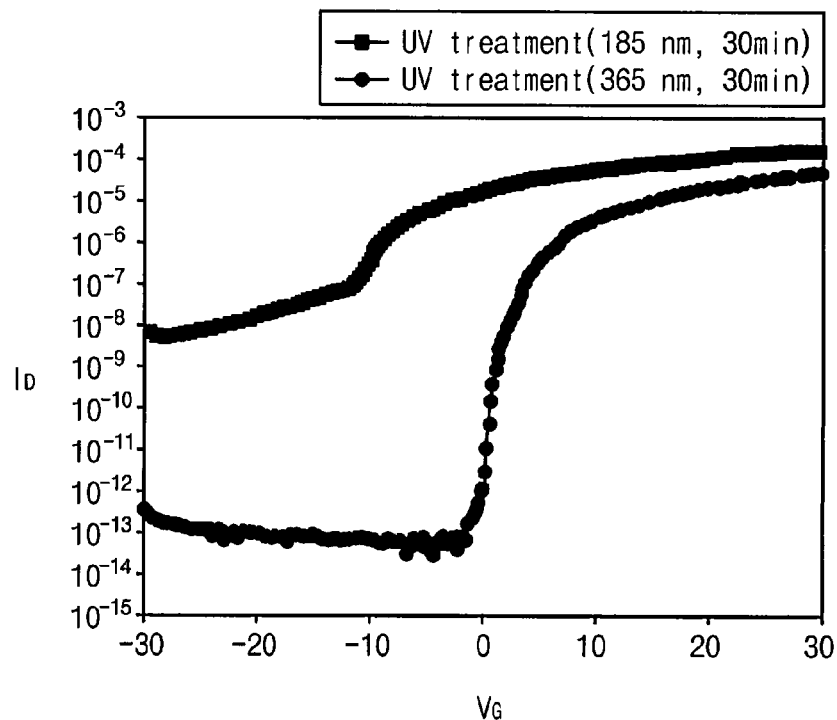
FIG. 7 is a graph illustrating the transfer characteristic of an oxide semiconductor device in accordance with a wavelength of an irradiated ultraviolet ray when an ultraviolet ray irradiation process is performed on the oxide semiconductor device.

FIG. 7 is a graph illustrating the transfer characteristic of an oxide semiconductor device in accordance with a wavelength of an irradiated ultraviolet ray when an ultraviolet ray irradiation process is performed on the oxide semiconductor device.

Referring to FIG. 7, ultraviolet rays having different wavelengths (e.g., about 185 nm and about 365 nm) were irradiated onto an oxide semiconductor device for about 30 minutes. In this case, the mobility of the oxide semiconductor device onto which an ultraviolet ray having a wavelength of about 185 nm was irradiated was higher than the mobility of the oxide semiconductor device onto which an ultraviolet ray having a wavelength of about 365 nm. In addition, the threshold voltage distribution of the oxide semiconductor device onto which an ultraviolet ray having the wavelength of about 185 nm was irradiated was lower than the threshold voltage distribution of the oxide semiconductor device onto which an ultraviolet ray having the wavelength of about 365 nm. Therefore, it may be appropriate that an ultraviolet ray irradiation process may be performed using an ultraviolet ray having a wavelength between about 185 nm and about 370 nm.

Figure 8:
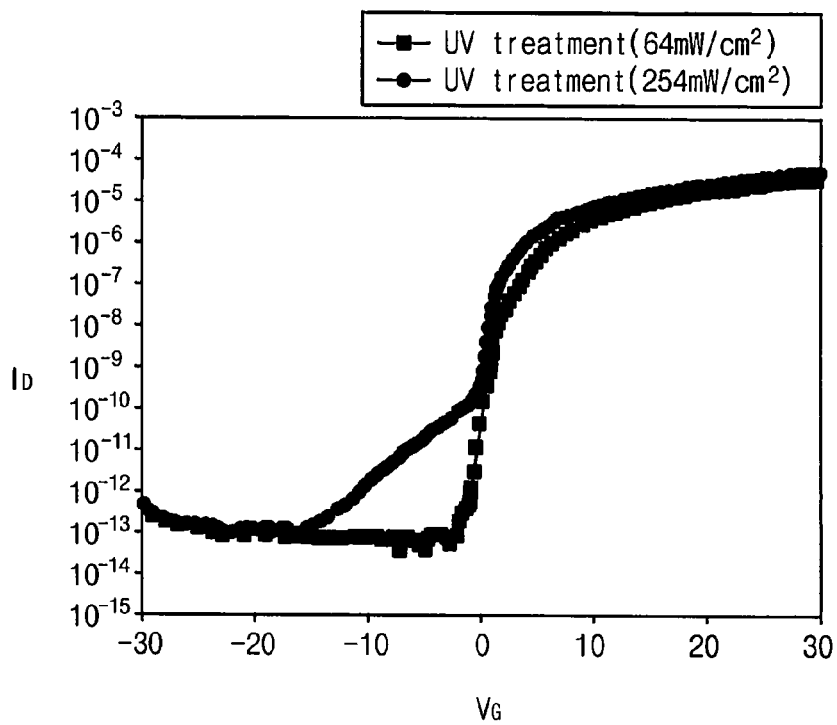
FIG. 8 is a graph illustrating the transfer characteristic of an oxide semiconductor device in accordance with an energy density of an irradiated ultraviolet ray when an ultraviolet ray irradiation process is performed on the oxide semiconductor device.

FIG. 8 is a graph illustrating the transfer characteristic of an oxide semiconductor device in accordance with an energy density of an irradiated ultraviolet ray when an ultraviolet ray irradiation process is performed on the oxide semiconductor device.

Referring to FIG. 8, ultraviolet rays having different energy densities (e.g., about 64 $mW/cm^2$ and about 254 $mW/cm^2$) were irradiated onto an oxide semiconductor device for about 30 minutes. In this case, the mobility of the oxide semiconductor device onto which an ultraviolet ray having an energy density of about 64 $mW/cm^2$ was irradiated was lower than the mobility of the oxide semiconductor device onto which an ultraviolet ray having an energy density of about 254 $mW/cm^2$. Further, the threshold voltage distribution of the oxide semiconductor device onto which an ultraviolet ray having the energy density of about 64 $mW/cm^2$ was irradiated was higher than the threshold voltage distribution of the oxide semiconductor device onto which an ultraviolet ray having the energy density of about 254 $mW/cm^2$. Therefore, it may be appropriate that an ultraviolet ray irradiation process may be performed using an ultraviolet ray the having an energy density less than about 254 $mW/cm^2$.

Figure 9:
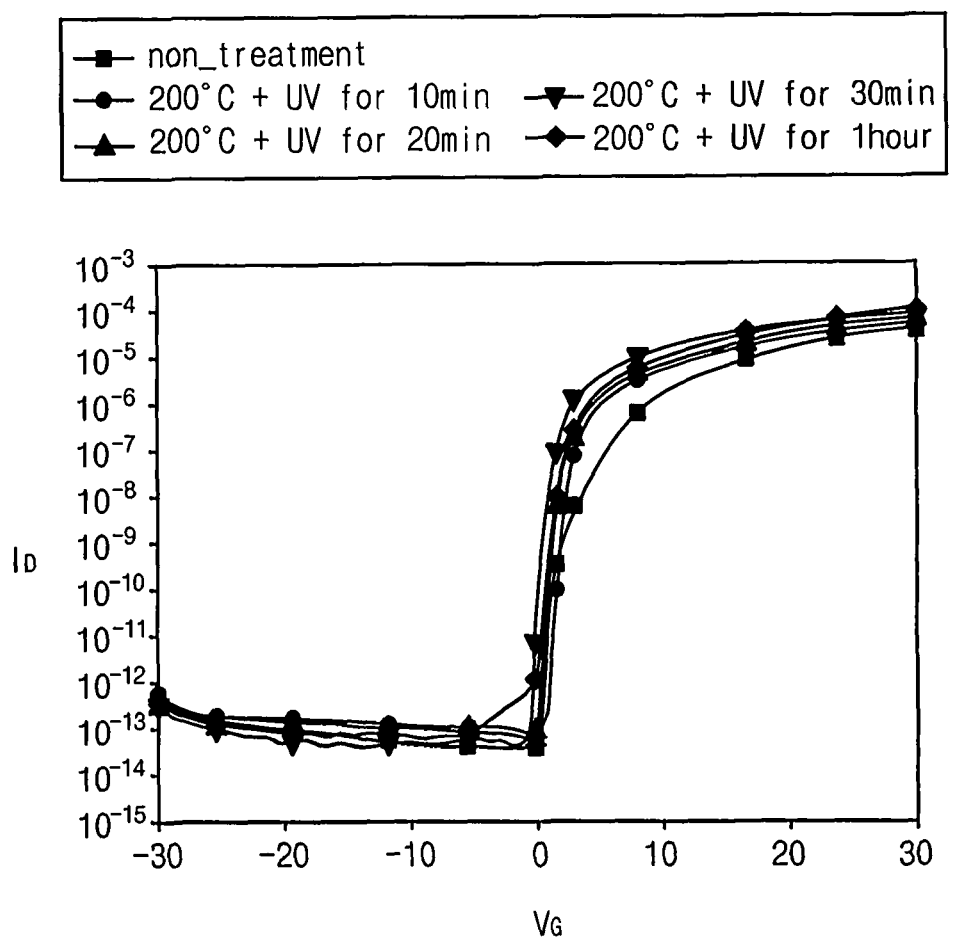
FIG. 9 is a graph illustrating the transfer characteristic of an oxide semiconductor device in accordance with process time when an ultraviolet ray irradiation process and a thermal treatment process are performed on the oxide semiconductor device at the same time.

FIG. 9 is a graph illustrating the transfer characteristic of an oxide semiconductor device in accordance with process time when an ultraviolet ray irradiation process and a thermal treatment process are performed on the oxide semiconductor device at the same time.

Referring to FIG. 9, an ultraviolet ray irradiation process and a thermal treatment process were simultaneously executed on the oxide semiconductor device for different process times. Here, the thermal treatment process was performed under an atmosphere including air at a temperature less than about 200° C., and the ultraviolet ray irradiation process was carried out using an the ultraviolet ray having a wavelength of about 365 nm and an energy density having about 254 $mW/cm^2$.

Table 1 shows mobilities of oxide semiconductor devices and threshold voltage distributions of oxide semiconductor devices in accordance with Comparative Example, Example 1, Example 2, Example 3, and Example 4.

TABLE 1

| No | Mobility of an oxide semiconductor device (cm$^2$/vs) | Threshold voltage distribution of an oxide semiconductor device (V) |
| --- | --- | --- |
| Comparative Example | 4.84 | 5.98 |
| Example 1 | 8.47 | 2.16 |
| Example 2 | 9.02 | 1.64 |
| Example 3 | 11.92 | 0.76 |
| Example 4 | 10.71 | 1.69 |

Example 1

An ultraviolet ray having a wavelength of about 365 nm and an energy density of about 254 mW/cm$^2$ was irradiated onto an oxide semiconductor device for about 10 minutes while heating the oxide semiconductor device for about 10 minutes under an air atmosphere at a temperature of about 200° C.

Example 2

An ultraviolet ray having a wavelength of about 365 nm and an energy density of about 254 mW/cm$^2$ was irradiated onto an oxide semiconductor device for about 20 minutes while heating the oxide semiconductor device for about 20 minutes under an air atmosphere at a temperature of about 200° C.

Example 3

An ultraviolet ray having a wavelength of about 365 nm and an energy density of about 254 mW/cm$^2$ was irradiated onto an oxide semiconductor device for about 30 minutes while heating the oxide semiconductor device for about 30 minutes under an air atmosphere at a temperature of about 200° C.

Example 4

An ultraviolet ray having a wavelength of about 365 nm and an energy density of about 254 mW/cm$^2$ was irradiated onto an oxide semiconductor device for about 1 hour while heating the oxide semiconductor device for about 1 hour under an air atmosphere at a temperature of about 200° C.

Comparative Example

An ultraviolet ray irradiation process and a thermal treatment process were not performed on an oxide semiconductor device.

As illustrated in FIG. 9, the mobilities of the oxide semiconductor devices in accordance with Example 1 to Example 3 were gradually increased from Example 1 to Example 3, and the threshold voltage distributions of the oxide semiconductor devices in accordance with Example 1 to Example 3 were gradually decreased from Example 1 to Example 3. As the process times of the ultraviolet ray irradiation process and the thermal treatment process was further increased, electrical characteristics of the oxide semiconductor device were more enhanced. In the case that the ultraviolet ray irradiation process and the thermal treatment process were performed for about 30 minutes, electrical characteristics of the oxide semiconductor device were efficiently improved. However, in Example 4, the mobility of the oxide semiconductor device was decreased, and the threshold voltage distribution of the oxide semiconductor device was increased. Accordingly, it may be appropriate that the ultraviolet irradiation process and the thermal treatment process may be performed for about 1 hour. That is, when an ultraviolet ray was irradiated onto the oxide semiconductor device for about 1 hour while heating the oxide semiconductor device for about 1 hour under an air atmosphere at a temperature of about 200° C., the electrical characteristics of the oxide semiconductor devices were efficiently enhanced.

FIGS. 10 through 18 are cross-sectional views illustrating a method of manufacturing a display device in accordance with example embodiments.

Figure 10:
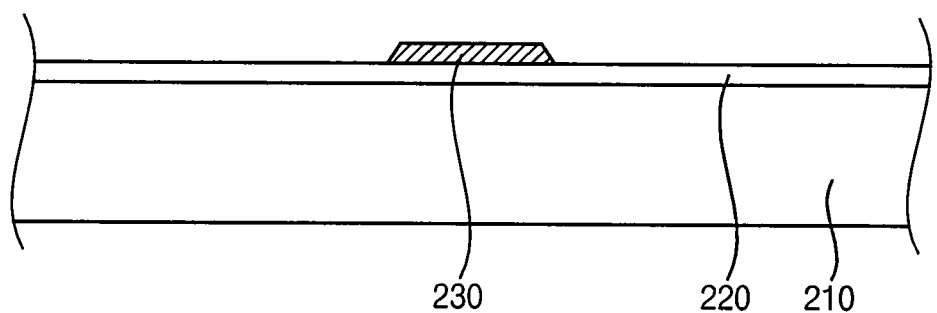
FIGS. 10 through 18 are cross-sectional views illustrating a method of manufacturing a display device in accordance with example embodiments.

Referring to FIG. 10, a gate electrode 230 may be formed on a substrate 210. For example, a conductive layer (not illustrated) may be formed on the substrate 210, and then the conductive layer may be patterned to form the gate electrode 230.

Figure 11:
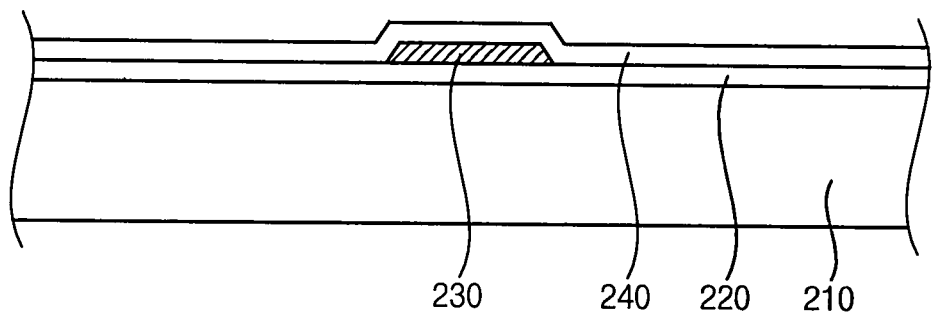

Referring to FIG. 11, a gate insulation layer 240 may be formed on the substrate 210 to cover the gate electrode 230. In example embodiments, the gate insulation layer 240 may have a relatively thick thickness to sufficiently cover the gate electrode 230. In some example embodiments, the gate insulation layer 240 having a substantially uniform thickness may be formed on the gate insulating layer 200 along a profile of the gate electrode 230. In some example embodiments, the gate insulation layer 240 having a relatively thin thickness may be formed on the gate insulating layer 200 along the profile of the gate electrode 230.

Figure 12:
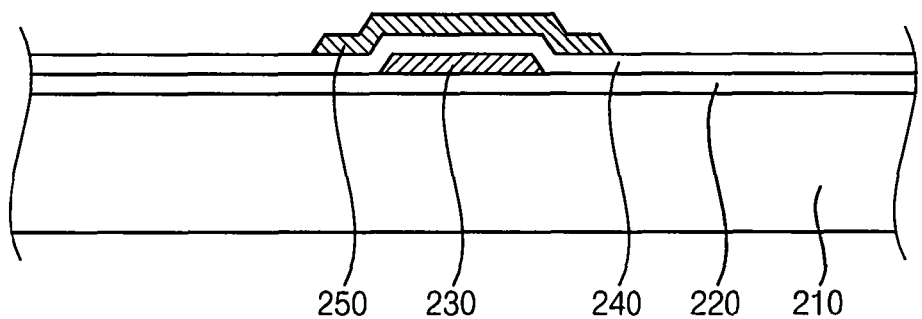

Referring to FIG. 12, an active pattern 250 may be formed on the gate insulation layer 240. In example embodiments, the active pattern 250 may be formed using a semiconductor oxide.

Figure 13:
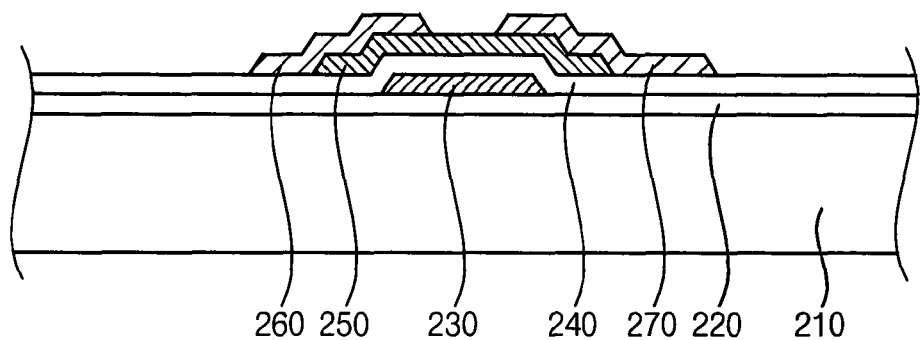

Referring to FIG. 13, an electrode layer (not illustrated) may be formed on the gate insulation layer 240 and the active pattern 250. The electrode layer may be substantially uniformly formed on the gate insulation layer 240 and the active pattern 250. The electrode layer may be patterned to form a source electrode 260 and a drain electrode 270. The source electrode 260 and the drain electrode 270 may be separated from each other by a predetermined distance substantially centering the active pattern 250. The source electrode 260 and the drain electrode 270 may extend on the gate insulation layer 240.

In the conventional method of forming a source electrode and a drain electrode of an oxide semiconductor device, damage to an active pattern may be caused while forming the source electrode and the drain electrode. When the damage to the active pattern may cause deterioration of electrical characteristics of the oxide semiconductor device, such as reduction of operating current, increase of threshold voltage distribution, reduction of mobility, etc. Although the conventional method of forming the oxide semiconductor device may include an ultraviolet ray irradiation process performed under an air atmosphere using an ultraviolet ray to enhance electrical characteristics of the active pattern, the conventional ultraviolet ray irradiation process may not sufficiently enhance the electrical characteristics of the active pattern because the threshold voltage distribution may be easily shifted even if the ultraviolet ray is irradiated for a short irradiation time. As a result, when the oxide semiconductor device is employed in the display device such as the organic light emitting display device, the liquid crystal display device, the flexible display device, etc., the display device including the oxide semiconductor device may have poor quality of images and relatively slow operating speed.

Figure 14:
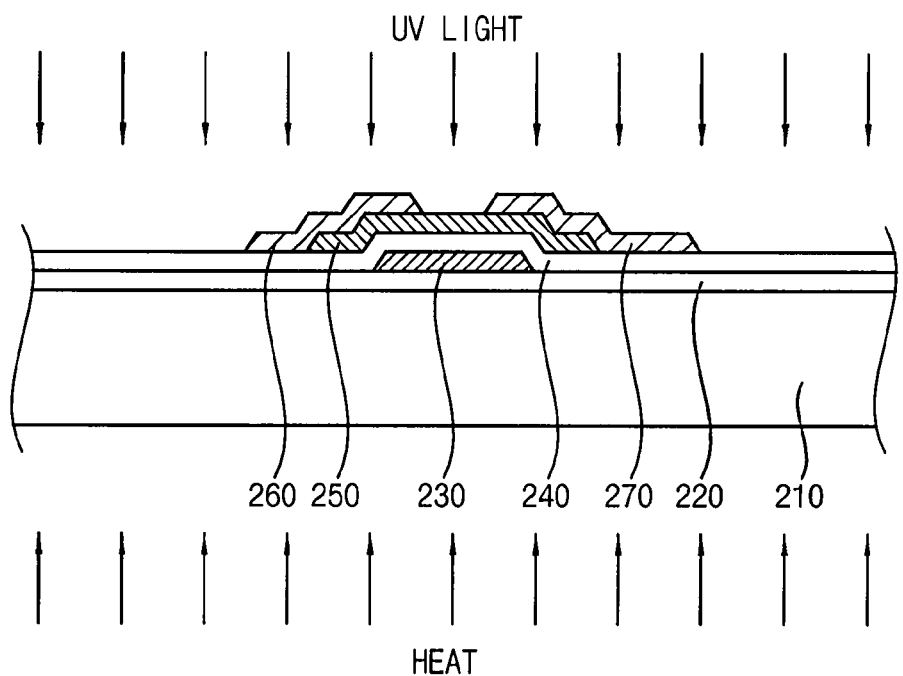

Considering these problems, as illustrated in FIG. 14 according to example embodiments, an ultraviolet ray irradiation process in which an ultraviolet ray may be irradiated onto the first face of the substrate 210, and simultaneously a thermal treatment process in which a heat may be applied to a second face of the substrate 210 opposed to the first face of the substrate 210. For example, the ultraviolet ray irradiation process may be performed for about 10 second to about 1 hour using an ultraviolet ray having a wavelength between about 185 nm and about 370 nm and an energy density less than about 254 mW/cm$^2$. In this case, the ultraviolet ray may be generated from an ultraviolet ray lamp or a short wavelength light emitting diode (LED). The thermal treatment process may be executed under an atmosphere including air, oxygen, ozone, nitrogen, or argon. In addition, the thermal treatment process may be carried out at a temperature less than about 400° C. for about 10 second to about 1 hour. The thermal treatment process may be performed using a hot plate or a furnace.

In some example embodiments, the ultraviolet ray irradiation process may be performed on the second face of the substrate 210, and the thermal treatment process may be executed about the first face of the substrate 210. In other example embodiments, the ultraviolet ray irradiation process and the thermal treatment process may be performed on the first and the second faces of the substrate 210 at the same time. Thus, the active pattern 250 may be cured, so that damage to the active pattern 250 generated in forming of the source electrode 260 and the drain electrode 270 may be efficiently reduced or removed. Additionally, moisture and/or hydroxyl group at a surface of the active pattern 250 generated while forming the source electrode 260 and the drain electrode 270 may be efficiently reduced or removed. Accordingly, the oxide semiconductor device may ensure enhanced electrical characteristics.

Figure 15:
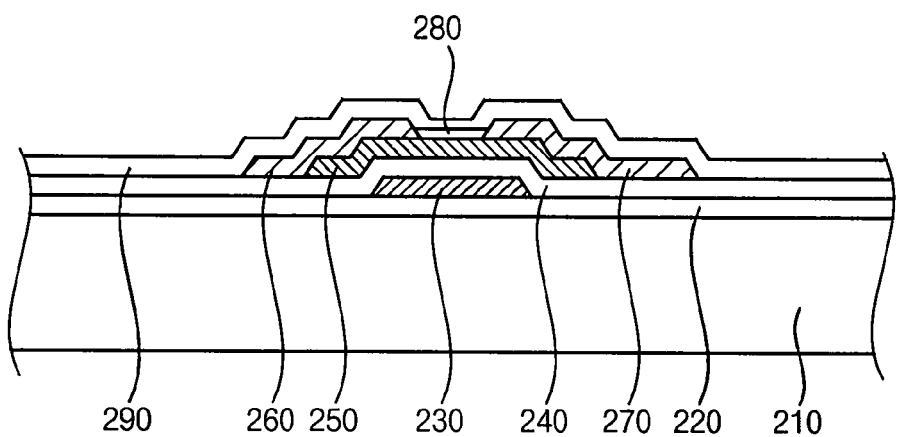

Referring to FIG. 15, an etching stop layer 280 may be formed on the active pattern 250 exposed by the source electrode 260 and the drain electrode 270. For example, the etching stop layer 280 may be formed using any of silicon oxide, silicon nitride, silicon oxynitride, semiconductor oxide, etc.

A protection layer 290 may be formed on the gate insulation layer 240 to cover the source electrode 260, the drain electrode 270, and the etching stop layer 280. For example, the protection layer 290 may include any of silicon oxide, silicon nitride, silicon oxynitride, etc.

Accordingly, the oxide semiconductor device including the gate electrode 230, the gate insulation layer 240, the active pattern 250, the source electrode 260, the drain electrode 270, the etching stop layer 280, and the protection layer 290 may be formed on the substrate 210.

Figure 16:
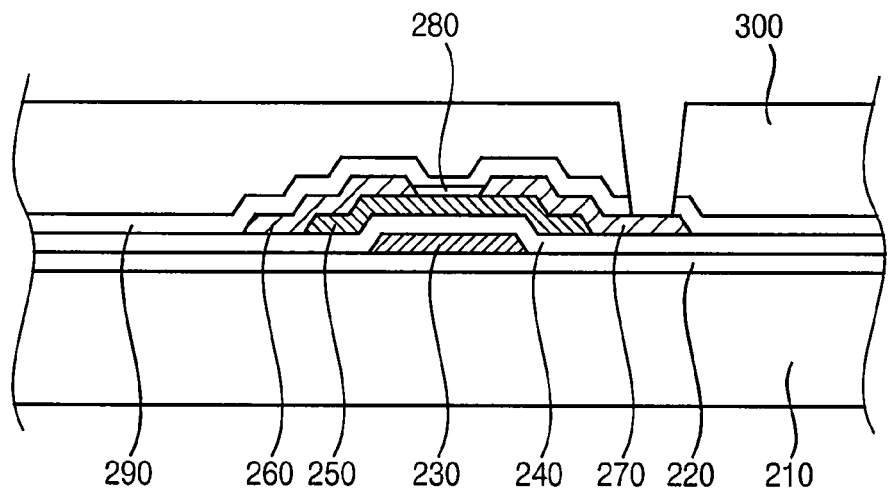

Referring to FIG. 16, an insulation layer 300 may be formed on the substrate 210 to cover the oxide semiconductor device. For example, the insulation layer 300 may be formed using a transparent insulation material. In example embodiments, a planarization process may be executed on the insulation layer 300 to enhance the flatness of an upper surface of the insulation layer 300.

Figure 17:
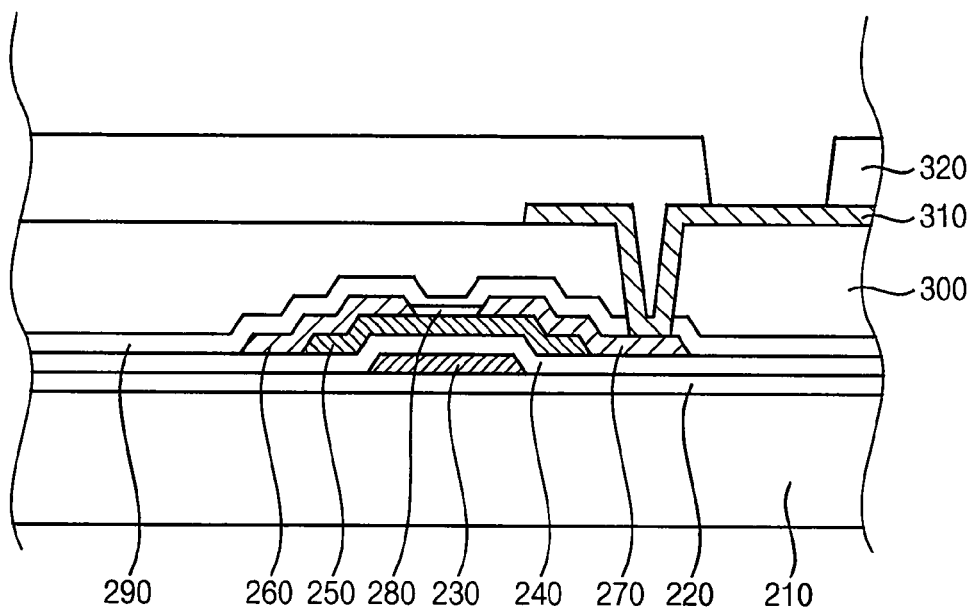

Referring to FIG. 17, the insulation layer 300 may be partially etched to form a hole partially exposing the drain electrode 270. The hole of the insulation layer 300 may be formed by a photolithography process.

A first electrode layer (not illustrated) may be formed on the insulation layer 300. The first electrode layer may be formed on the drain electrode 270 and the insulation layer 300 along a profile of the insulation layer 300. The first electrode layer may have a substantially uniform thickness. The first electrode layer may include any of a transparent conductive material, a semi-transparent conductive material, a reflective conductive material, etc.

The first electrode layer may be patterned to form a first electrode 310 connected to the drain electrode 270. In this case, the first electrode 310 may correspond to a pixel electrode of the display device. The first electrode 310 may be formed on an exposed drain electrode 270, a sidewall of the hole, and the insulation layer 300.

A pixel defining layer 320 may be formed on the first electrode 310. In example embodiments, the pixel defining layer 320 may be formed using a transparent insulating material. For example, the pixel defining layer 320 may be formed using any of an organic material (e.g., polyacryl-based resin, polyimide-based resin, etc.), a silica-based inorganic material, etc.

The pixel defining layer 320 may be partially etched to form an opening that exposes the first electrode 310. For example, the opening may have a sidewall inclined by a predetermined angle relative to the substrate 210. Thus, an organic light emitting layer 330 and/or a second electrode 340 (e.g., as shown in FIG. 18) may be subsequently easily formed in accordance with the predetermined angle of the sidewall of the opening.

Figure 18:
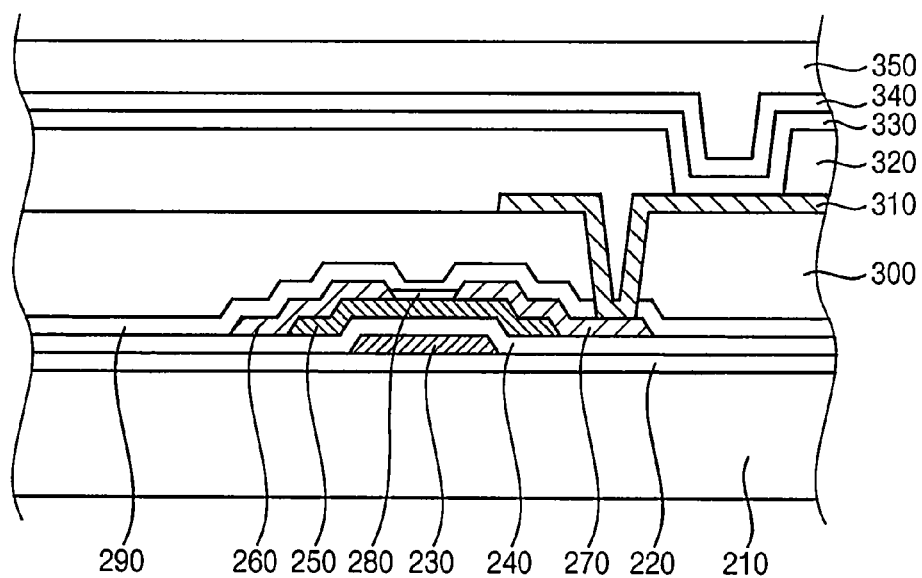

As illustrated in FIG. 18, an organic light emitting layer 330 may be formed on the first electrode 310, the sidewall of the opening, and the pixel defining layer 320. The organic light emitting layer 330 may be formed on a first electrode 310 exposed along a profile of the opening, the sidewall of the opening, and the pixel defining layer 320. The organic light emitting layer 330 may include low molecular organic materials, high molecular inorganic materials generating a red color of light, a material generating a green color of light or a material generating a blue color of light. Additionally, the organic light emitting layer 330 may have a multi-layer structure, which may include any of a hole injection layer, a hole transfer layer, an emitting layer, an electron transfer layer, an electron injection layer, etc.

A second electrode 340 may be formed on the organic light emitting layer 330. The second electrode 340 may include any of a transparent conductive material, a semi-transparent conductive material, a reflective conductive material, etc. The second electrode 340 may be formed on the organic light emitting layer 330. In some example embodiments, when the organic light emitting layer 330 is formed on only the first electrode 310, the second electrode 340 may be formed in only the opening of the pixel defining layer 320. For example, the organic light emitting layer 330 may be formed on only the first electrode 310 and the sidewall of the opening, and the second electrode 340 may be formed on the organic light emitting layer 330. For example, a second electrode layer may be formed on the organic light emitting layer 330 and the pixel defining layer 320, and then the second electrode layer may be patterned to form the second electrode 340.

A second substrate 350 opposed to the substrate 210 (e.g., on the opposite side of the substrate 210 as shown in FIG. 18) may be provided over the second electrode 340. For example, the second substrate 350 may include a transparent insulation material.

As illustrated above, the display device may include the oxide semiconductor device having enhanced electrical characteristics, so that the display device may have increased quality of images and enhances operating speed.

According to example embodiments, an ultraviolet ray irradiation process and a thermal treatment process may be simultaneously performed after forming of a source electrode and a drain electrode. Thus, damage caused to an active pattern while forming the source and the drain electrodes may be prevented. In addition, moisture and/or hydroxyl group generated in process of forming the oxide semiconductor device may be efficiently reduced or removed. Accordingly, the oxide semiconductor device according to example embodiments may ensure enhanced electrical characteristics such as reduction of operating current, increase of threshold voltage distribution, reduction of mobility, etc. As a result, when the oxide semiconductor device is employed in the display device such as the organic light emitting display device, the liquid crystal display device, the flexible display device, etc., the display device may have increased quality of images and enhanced operating speed.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of making an oxide semiconductor device, the method comprising:
   providing a substrate comprising a first major surface and a second major surface that faces away from the first major surface;
   forming an oxide active layer over the first major surface;
   forming a conductive layer over the oxide active layer;
   etching a portion of the conductive layer with an etchant to split the conductive layer into source and drain electrodes and to expose a portion of the oxide active layer, wherein during etching, the etchant contacts the exposed portion of the oxide active layer, which deteriorates at least one electrical property of the oxide active layer;
   subsequent to etching, subjecting the oxide active layer to a UV light treatment and a heat treatment to improve the at least one electrical property deteriorated by etching, wherein the UV light treatment is performed for a first period and the heat treatment is performed for a second period, wherein the first and second periods at least partly overlap.

2. The method of claim 1, wherein the first period is from about 10 second to about 1 hour.

3. The method of claim 1, wherein the UV light treatment comprises applying a UV light having a wavelength between about 185 nm and about 370 nm.

4. The method of claim 1, wherein the UV light treatment comprises projecting UV light beams from an ultraviolet ray lamp or a short wavelength light emitting diode (LED).

5. The method of claim 1, wherein the UV light treatment comprises projecting UV light beams having an energy density less than about 254 mW/cm$^2$.

6. The method of claim 1, wherein the heat treatment is performed under an atmosphere including air, oxygen, ozone, nitrogen or argon.

7. The method of claim 1, wherein the second period is from about 10 second to about 1 hour.

8. The method of claim 1, wherein the heat treatment comprises applying heat having a temperature less than about 400° C.

9. The method of claim 1, wherein the heat treatment is performed using a hot plate or a furnace.

10. The method of claim 1, wherein the UV light treatment comprises applying a UV light from a side of the first major surface or from a side of the second major surface, and the heat treatment comprises applying heat from the side of the first major surface or from the side of the second major surface.

11. The method of claim 1, wherein the UV light treatment comprises applying a UV light from a side of the first major surface and from a side of the second major surface, and the heat treatment comprises applying heat from the side of the first major surface and from the side of the second major surface.

12. The method of claim 1, wherein the oxide active layer comprises a semiconductor oxide including at least one selected from the group consisting of a binary compound (ABx), a ternary compound (ABxCy), and a quaternary compound (ABxCyDz).

13. The method of claim 1, wherein the oxide active layer comprises a semiconductor oxide including at least one selected from the group consisting of indium (In), zinc (Zn), gallium (Ga), stannum (Sn), titanium (Ti), aluminum (Al), hafnium (I-If), zirconium (Zr), and magnesium (Mg).

14. The method of claim 1, wherein the oxide active layer comprises a semiconductor oxide and at least one selected from the group consisting of lithium (Li), natrium (Na), manganese (Mn), nickel (Ni), palladium (Pd), copper (Cu), carbon (C), nitrogen (N), phosphorus (P), titanium (Ti), zirconium (Zr), vanadium (V), rubidium (Ru), germanium (Ge), stannum (Sn), and fluorine (F).

15. The method of claim 1, further comprising:
   forming an etching stop layer over the oxide active layer; and
   forming a protection layer over the etching stop layer.

16. The method of claim 15, wherein forming the etching stop layer and forming the protection layer are performed after the first and second periods.

17. A method of manufacturing a display device, the method comprising:
   the method of claim 1;
   subsequent to the UV light and heat treatments, forming a light emitting diode over the first major surface, the light emitting diode being connected to the conductive layer and comprising an organic light emitting layer.

18. The method of claim 17, wherein the UV light treatment comprises applying a UV light from a side of the first major surface, from a side of the second major surface, or both, and wherein the heat treatment comprises applying heat from the side of the first major surface, the side of the second major surface, or both.

19. The method of claim 17, further comprising:
   forming an etching stop layer over the oxide active layer; and
   forming a protection layer over the etching stop layer.

20. The method of claim 19, wherein forming the etching stop layer and forming the protection layer are performed after the first and second periods.

* * * * *